(12) United States Patent
Yamazoe et al.

(10) Patent No.: US 11,437,840 B2
(45) Date of Patent: Sep. 6, 2022

(54) BATTERY CONTROL SYSTEM

(71) Applicant: Hitachi, Ltd., Tokyo (JP)

(72) Inventors: Takanori Yamazoe, Tokyo (JP); Kei Sakabe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 97 days.

(21) Appl. No.: 16/326,681

(22) PCT Filed: Jul. 19, 2017

(86) PCT No.: PCT/JP2017/026054
§ 371 (c)(1),
(2) Date: Feb. 19, 2019

(87) PCT Pub. No.: WO2018/037776
PCT Pub. Date: Mar. 1, 2018

(65) Prior Publication Data
US 2019/0190302 A1 Jun. 20, 2019

(30) Foreign Application Priority Data
Aug. 24, 2016 (JP) .............................. JP2016-163530

(51) Int. Cl.
*H02J 7/02* (2016.01)
*H02J 50/10* (2016.01)
*H02J 7/00* (2006.01)

(52) U.S. Cl.
CPC ............ *H02J 7/025* (2013.01); *H02J 7/0013* (2013.01); *H02J 7/02* (2013.01); *H02J 50/10* (2016.02)

(58) Field of Classification Search
CPC .. H02J 7/025; H02J 7/0013; H02J 7/02; H02J 7/00; H02J 50/10
(Continued)

(56) References Cited

U.S. PATENT DOCUMENTS 7,392,011 B1 * 6/2008 Jacomb-Hood ........ H01Q 1/288
342/368
9,728,821 B2 * 8/2017 Komatsu ................... B60L 1/00
(Continued)

FOREIGN PATENT DOCUMENTS

| JP | 48-086419 | 11/1973 |
| JP | 2005-135762 | 5/2005 |

(Continued)

OTHER PUBLICATIONS

Office Action issued in corresponding Japanese Patent Application No. 2018-535526 dated May 26, 2020, with English machine translation.
(Continued)

*Primary Examiner* — Richard Isla
*Assistant Examiner* — Dung V Bui
(74) *Attorney, Agent, or Firm* — Foley & Lardner LLP

(57) ABSTRACT

In the battery control system pertaining to the present invention, one antenna is provided for each cell controller or each group of cell controllers. A battery controller switches between antennas by using a switch and performs wireless communication with each cell controller or each group of cell controllers. Hence, even if the number of cell controllers increases, a countermeasure can be taken by adding antennas and changing switches, and an increase in the number of battery controllers can be suppressed.

12 Claims, 10 Drawing Sheets

(58) Field of Classification Search
USPC .......................................................... 320/108
See application file for complete search history.

(56) References Cited

U.S. PATENT DOCUMENTS

| | | | | |
|---|---|---|---|---|
| 2010/0073003 | A1* | 3/2010 | Sakurai | H01M 10/482 |
| | | | | 324/426 |
| 2011/0217960 | A1* | 9/2011 | Tanaka | H04W 76/10 |
| | | | | 455/414.1 |
| 2011/0249760 | A1* | 10/2011 | Chrisikos | H01Q 1/243 |
| | | | | 375/259 |
| 2012/0320955 | A1 | 12/2012 | Ueda et al. | |
| 2013/0310109 | A1* | 11/2013 | Filipovic | H04W 76/18 |
| | | | | 455/553.1 |
| 2014/0079963 | A1 | 3/2014 | Takeuchi et al. | |
| 2014/0148095 | A1* | 5/2014 | Smith | H04B 7/0602 |
| | | | | 455/41.1 |
| 2014/0285156 | A1 | 9/2014 | Mukaitani et al. | |
| 2014/0306667 | A1 | 10/2014 | Mukaitani et al. | |
| 2014/0312915 | A1 | 10/2014 | Mukaitani et al. | |
| 2014/0354291 | A1* | 12/2014 | Kikuchi | H02J 7/0047 |
| | | | | 324/434 |
| 2015/0280321 | A1* | 10/2015 | Tang | H01Q 3/46 |
| | | | | 343/832 |
| 2015/0282077 | A1* | 10/2015 | Yavuz | H04W 72/082 |
| | | | | 455/452.1 |
| 2016/0006085 | A1* | 1/2016 | Toya | H01M 10/48 |
| | | | | 429/90 |
| 2016/0056510 | A1 | 2/2016 | Takeuchi et al. | |
| 2016/0173172 | A1* | 6/2016 | Greene | H04B 7/0802 |
| | | | | 455/562.1 |
| 2016/0301112 | A1 | 10/2016 | Yamazoe et al. | |
| 2017/0351561 | A1 | 12/2017 | Yamazoe et al. | |

FOREIGN PATENT DOCUMENTS

| | | |
|---|---|---|
| JP | 2006-072663 A | 3/2006 |
| JP | 2011-176481 A | 8/2011 |
| JP | 2014-057489 A | 3/2014 |
| JP | 2014-197345 A | 10/2014 |
| WO | WO-2013/069328 A1 | 5/2013 |
| WO | WO-2013/069346 A1 | 5/2013 |
| WO | WO-2013/069423 A1 | 5/2013 |
| WO | WO-2014/103008 A1 | 7/2014 |
| WO | WO-2014-156264 A1 | 10/2014 |
| WO | WO-2016-072002 A1 | 5/2016 |

OTHER PUBLICATIONS

International Search Report (with English Language Translation) and Written Opinion (Japanese Language only) issued in PCT/JP2017/026054 dated Aug. 22, 2017.

Office Action issued in corresponding Japanese Patent Application No. 2018-535526 dated Dec. 3, 2019, with English machine translation.

Office Action issued in corresponding Japanese Application No. 2021-64063 dated Jun. 7, 2022 (11 pages).

* cited by examiner

BATTERY CONTROL SYSTEM

TECHNICAL FIELD

The present invention relates to a technique for controlling a battery.

BACKGROUND ART

Currently, there is much focus on global environmental issues, and the reduction of carbon dioxide gas emission is required in every scene in order to prevent global warming. With regard to vehicles with gasoline engines, which are a major source of carbon dioxide gas emission, replacement of such vehicles with hybrid electric vehicles and electric vehicles has begun.

Large-size secondary batteries, typified by power sources for hybrid electric vehicles and electric vehicles, are required to have high output and large capacity. Therefore, storage battery modules constituting large-size secondary batteries are formed by connecting a plurality of batteries (hereinafter referred to as cells) in series and in parallel. Further, with regard to lithium ion batteries, which are secondary batteries, it is necessary to prevent high-voltage charging and to appropriately prevent performance degradation due to overdischarge. Hence, storage battery modules mounted on hybrid electric vehicles and electric vehicles have the function of detecting battery state, i.e., battery voltage, current, temperature, etc.

A battery control system typically has cell controllers (CCs) and a battery controller (BC). Each CC measures the battery state of one or more cells. The BC obtains cell battery state from each CC, and based on the result thereof, calculates the state of charge (SOC) and the state of health (SOH). The BC notifies a superordinate controller, etc., of the calculation result.

PTL 1 discloses a configuration of a battery control system. In this document, CCs and a BC are connected by wireless communication, whereby an attempt is made to reduce wiring cost, the cost of insulation as a countermeasure against high voltage, assembly cost, etc.

CITATION LIST

Patent Literature

PTL 1: JP 2005-135762 A

SUMMARY OF INVENTION

Technical Problem

In the technique disclosed in PTL 1, one BC performs wireless communication with a plurality of CCs. Due to this, when the number of CCs increases, communication performance may become insufficient with only one BC. In view of this, a measure can be considered of increasing the number of BCs as the number of CCs increases. However, an increase in the number of BCs increases battery control system cost.

The present invention has been made in view of the above-described problems, and an aim thereof is to provide a technique that suppresses an increase in the number of BCs even when the number of CCs increases and is thereby capable of suppressing battery control system cost.

Solution to Problem

In the battery control system pertaining to the present invention, one antenna is provided for each cell controller or each group of cell controllers. A battery controller switches between antennas by using a switch and performs wireless communication with each cell controller or each group of cell controllers.

Advantageous Effects of Invention

According to the battery control system pertaining to the present invention, even if the number of cell controllers increases, a countermeasure can be taken by adding antennas and changing switches. Hence, an increase in the number of battery controllers can be suppressed, and thus an increase in battery control system cost can be suppressed.

DESCRIPTION OF EMBODIMENTS

First Embodiment

Figure 1:
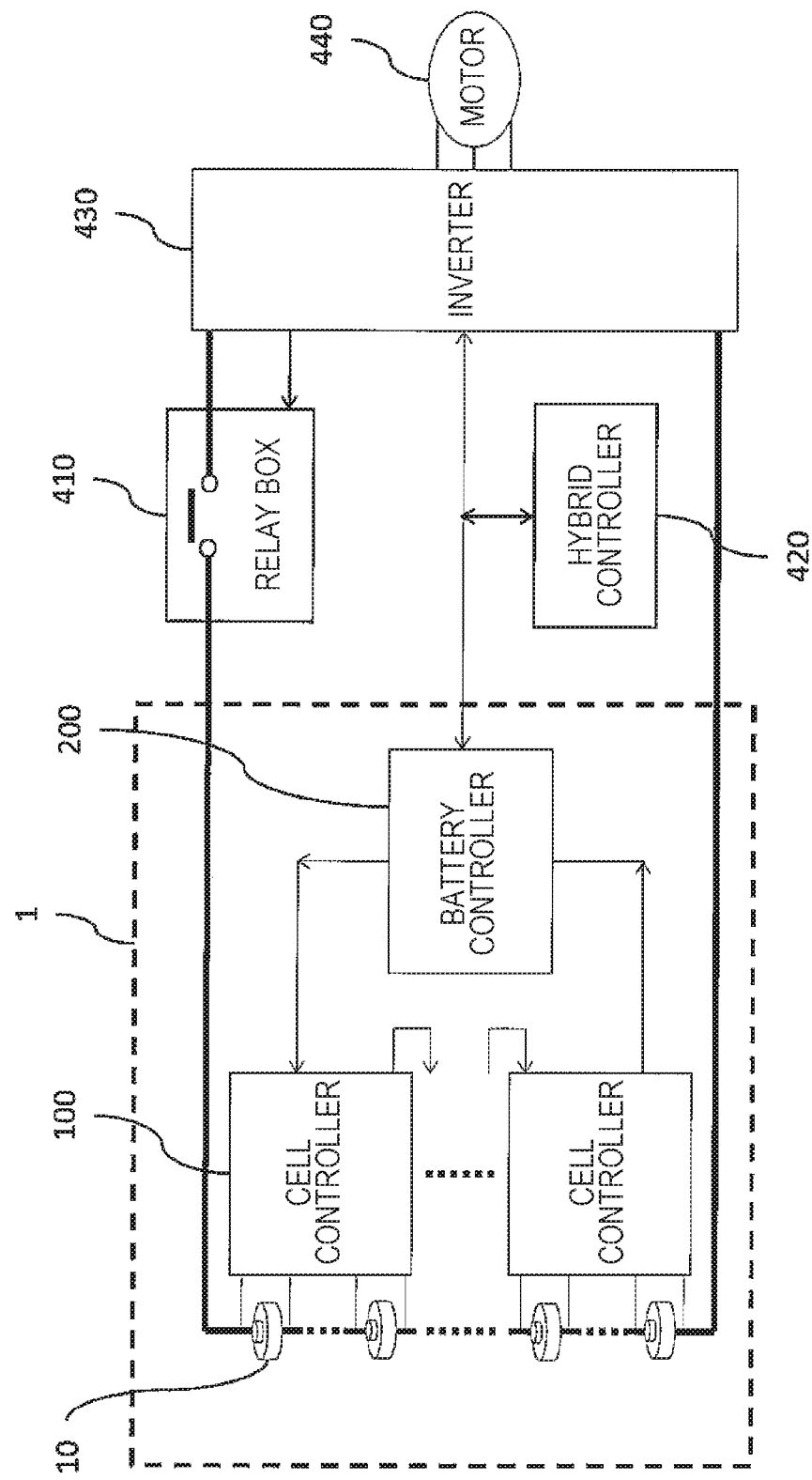
FIG. 1 is a diagram illustrating a configuration of a battery control system 1 pertaining to a first embodiment.

FIG. 1 is a diagram illustrating a configuration of a battery control system 1 pertaining to a first embodiment of the present invention. The battery control system 1 is a system for controlling cells 10. The battery control system 1 supplies power supplied by the cells 10 to an inverter 430, via a relay box 410. The inverter 430 drives and controls a motor 440. A hybrid controller 420 is a superordinate controller that controls the entirety of the system including the battery control system 1.

The battery control system 1 includes a cell controller (CC) 100 and a battery controller (BC) 200. The cell controller 100 is connected to a cell group having one or more cells 10 and measures the state of each cell 10 belonging to the cell group. When there is a plurality of cell groups, one cell controller 100 is arranged for each cell group. The battery controller 200 acquires the state of the cells 10 from each cell controller 100. The cell controllers 100 and the battery controller 200 are connected by using wireless communication, description of which is provided in FIG. 2.

Figure 2:
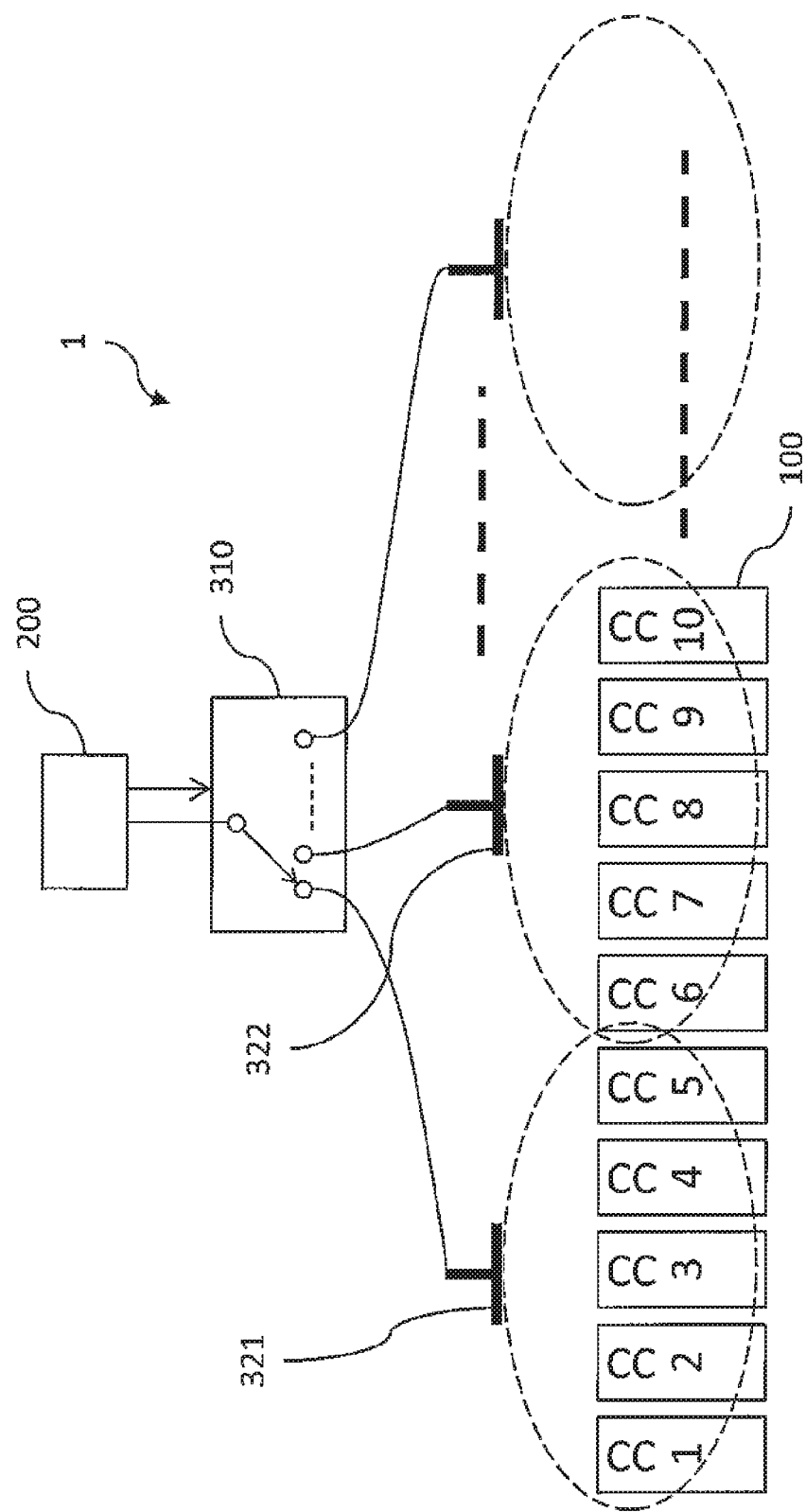
FIG. 2 is a diagram describing connection between cell controllers 100 and a battery controller 200.

FIG. 2 is a diagram describing the connection between the cell controllers 100 and the battery controller 200. In FIG. 2, it is assumed that the first to fifth cell controllers (CCs 1 to 5) form a first cell controller group and the sixth to tenth cell controllers (CCs 6 to 10) form a second cell controller group. In the following, it is assumed that there are only two cell controller groups for convenience of description. However, the same configuration can be adopted even when there are three or more cell controller groups.

The battery control system 1 includes one antenna for each cell controller group. In FIG. 2, an antenna 321 performs wireless communication with each cell controller belonging to the first cell controller group, and an antenna 322 performs wireless communication with each cell controller belonging to the second cell controller group. The battery controller 200 performs wireless communication with each cell controller belonging to the first cell controller group via the antenna 321 and performs wireless communication with each cell controller belonging to the second cell controller group via the antenna 322.

The battery control system 1 includes a switch 310. The switch 310 switches between connection of the battery controller 200 to the antenna 321 and connection of the battery controller 200 to the antenna 322. By switching the switch 310, the battery controller 200 can switch the cell controller group with which the battery controller 200 performs wireless communication.

When communication radio wave intensity is taken into account, it is desirable to install the antenna 321 and the antenna near the first cell controller group and to install the antenna 322 near the second cell controller group.

Figure 3:
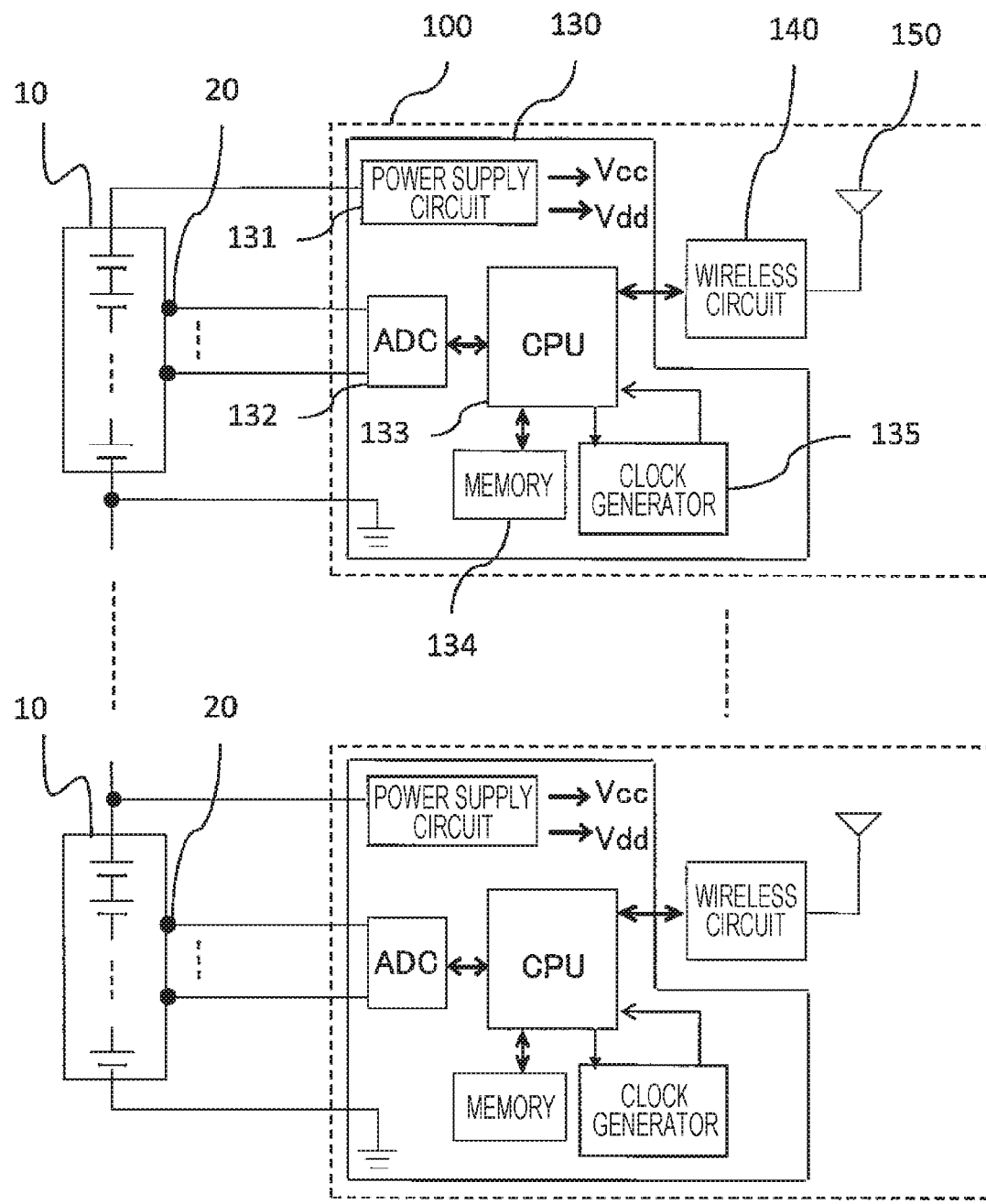
FIG. 3 is a diagram illustrating a configuration of the cell controllers 100.

FIG. 3 is a configuration diagram of the cell controllers 100. Each cell controller 100 acquires the state (voltage, current, temperature, etc.) of cells 10 from sensors 20 attached to the cells 10 or near the cells 10. The cell controller 100 includes: a processor 130; a wireless circuit 140; and an antenna 150. The wireless circuit 140 performs wireless communication with the antenna 321 or 322 via the antenna 150.

The processor 130 includes: a power supply circuit 131; an analog/digital conversion circuit (ADC) 132; a central processing unit (CPU) 133; a memory 134; and a clock generator 135. The power supply circuit 131 receives power from the cells 10 and outputs operation voltages Vcc and Vdd by using the power. The ADC 132 converts measurement signals output from the sensors 20 into digital data. The CPU 133 acquires the output of the ADC 132 and wirelessly transmits the output via the wireless circuit 140. The memory 134 is a storage device that stores data such as a later-described antenna ID. The clock generator 135 can switch between and oscillate a high-speed clock of about several MHz and a low-speed clock of about several tens of kHz.

For example, the CPU 133 performs the following processing based on communication data that the wireless circuit 140 receives: (a) turning on and off each circuit included in the cell controller 100; (b) switching the clock frequency that the clock generator 135 oscillates; (c) reading/writing with respect to the memory 134; and (d) implementation of instructions received from the battery controller 200.

Figure 4:
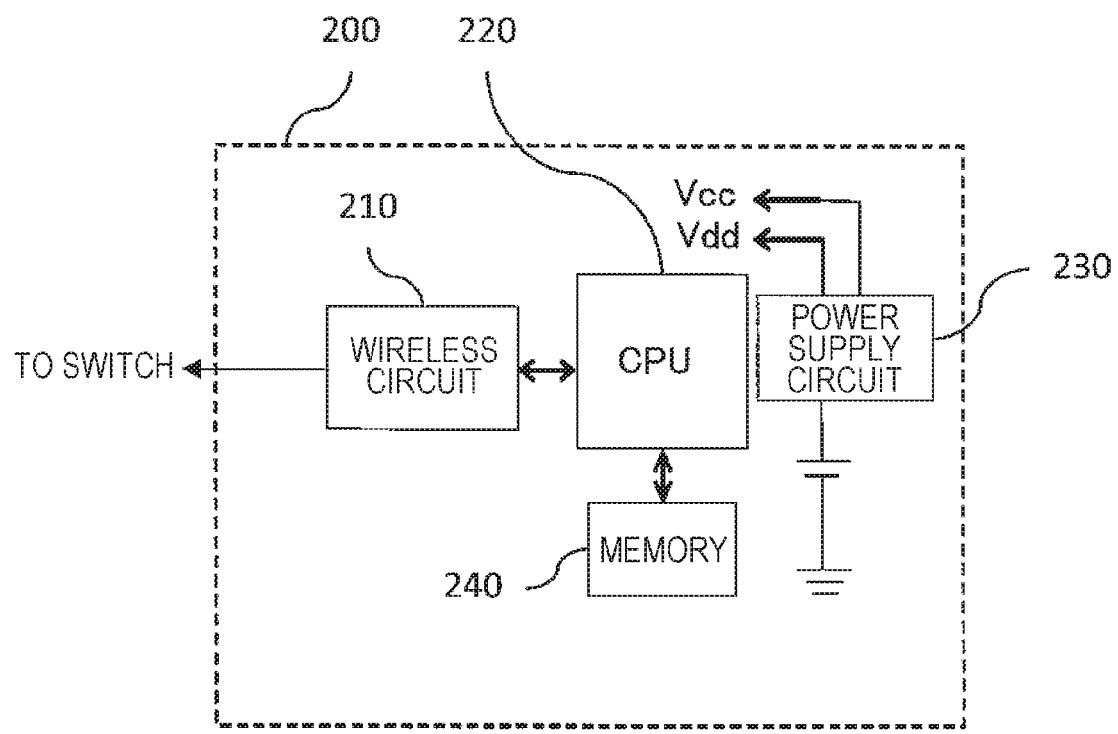
FIG. 4 is a diagram illustrating a configuration of the battery controller 200.

FIG. 4 is a diagram illustrating a configuration of the battery controller 200. The battery controller 200 includes: a wireless circuit 210; a CPU 220; a power supply circuit 230; and a memory 240. The switch 310 and the antennas 321 and 322 may be configured as constituent elements of the battery controller 200, or may be provided separately from the battery controller 200.

The wireless circuit 210 performs wireless communication with the cell controllers 100 via the switch 310 and the antennas 321 and 322. The power supply circuit 230 receives power supply from a battery included in the battery controller 200 or an external battery, and outputs operation voltages Vcc and Vdd by using the supplied power. The memory 240 is a storage device that stores data such as the later-described antennas ID. The CPU 220 performs wireless communication via the wireless circuit 210, and thereby transmits instructions to the cell controllers 100 and receives measurement results of the states of cells 10 from the cell controllers 100.

The battery controller 200 performs time-division switching of the switch 310 and thereby performs time-division wireless communication with the cell controller groups. Further, when two or more cell controllers belong to a cell controller group, the battery controller 200 and the cell controllers perform time-division wireless communication by using time slots allocated in advance so that mutual contention of communication does not occur. Description of the specific procedure therefor is provided in the following.

Figure 5:
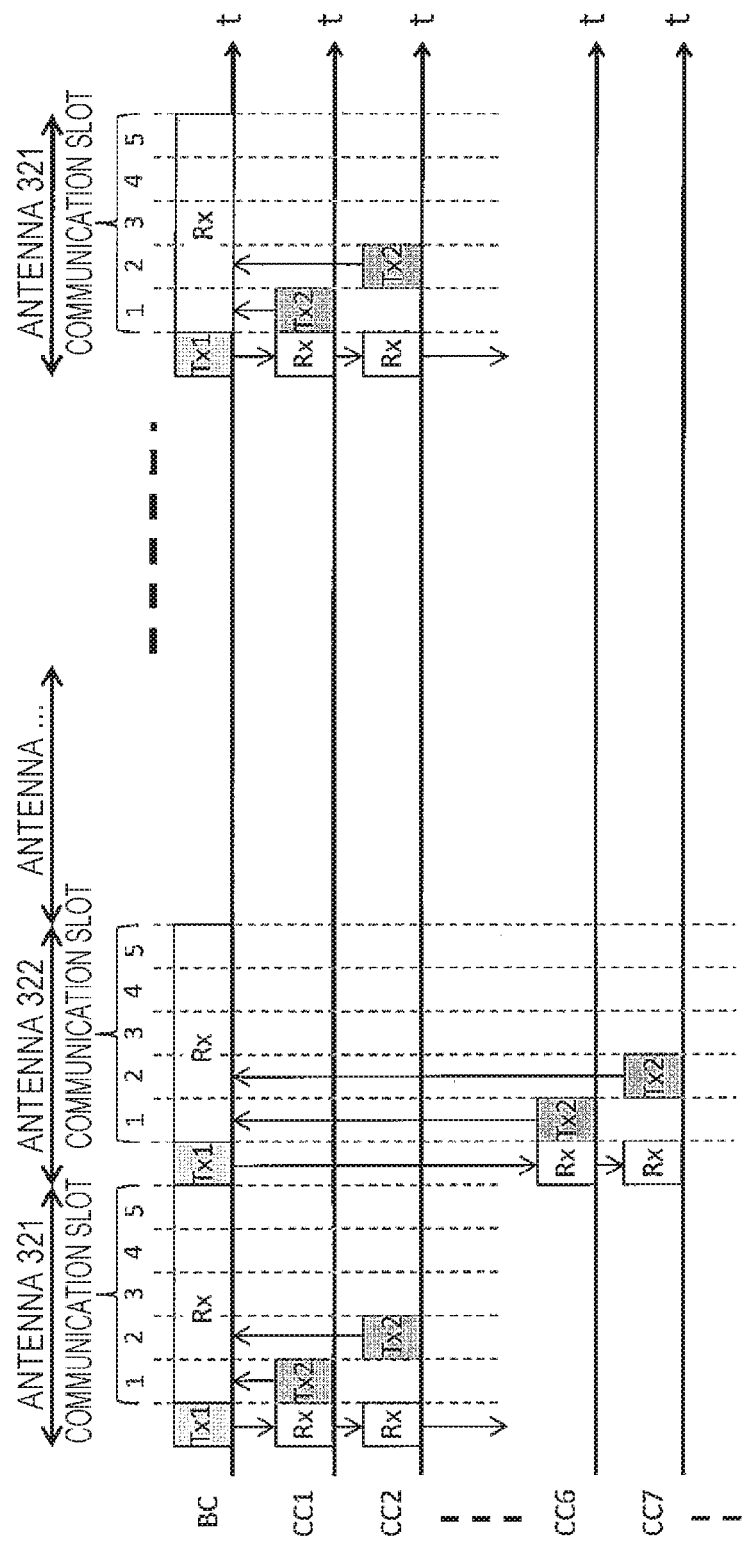
FIG. 5 is a time chart describing a procedure of communication between the battery controller 200 and the cell controllers 100.

FIG. 5 is a time chart describing the procedure of communication between the battery controller 200 and the cell controllers 100. Here, it is assumed that CCs 1 to 5 form a first cell controller group and CCs 6 to 10 form a second cell controller group, as illustrated in FIG. 2. Description of the communication procedure between controllers is provided in the following, with reference to FIG. 5.

The battery controller 200 connects the switch 310 to the antenna 321 and performs broadcast transmission of a command requesting transmission of the states of cells 10 via the antenna 321. The battery controller 200 includes description of an identifier (antenna ID) of the antenna 321 in the command.

CCs 1 to 5 belonging to the first cell controller group each compare the antenna ID stored in advance in the memory 134 with the antenna ID received from the battery controller 200. When the antenna IDs match, CCs 1 to 5 each transmit communication data including description of states of cells 10 as a reply to the command transmitted by the battery controller 200.

When a plurality of CCs belong to a cell controller group, a time slot is allocated to each cell controller in advance, and each cell controller transmits the communication data to the battery controller 200 within the time slot allocated thereto. In the example illustrated in FIG. 5, wireless communication with the battery controller 200 is performed within the predetermined time slot, in order from CC 1. The battery controller 200 receives communication data from each cell controller.

Depending on the position and the radio wave intensity of the antenna 321, CCs 6 to 10 may also receive the command from the battery controller 200. However, since CCs 6 to 10 hold the ID of the antenna 322 in the memory 134 as described later, CCs 6 to 10 do not respond to the command from the battery controller 200 at this point.

The battery controller 200 connects the switch 310 to the antenna 322 when the time slots allocated to CCs 1 to 5 have all elapsed. The battery controller 200 performs broadcast transmission of a command requesting transmission of the states of cells 10 via the antenna 322. The battery controller 200 includes description of an identifier (antenna ID) of the antenna 322 in the command.

CCs 6 to 10 belonging to the second cell controller group each compare the antenna ID stored in advance in the memory 134 with the antenna ID received from the battery controller 200. When the antenna IDs match, CCs 6 to 10 each transmit communication data including description of states of cells 10 as a reply to the command transmitted by the battery controller 200. The operations following this point are similar to those for the first cell controller group.

Figure 6:
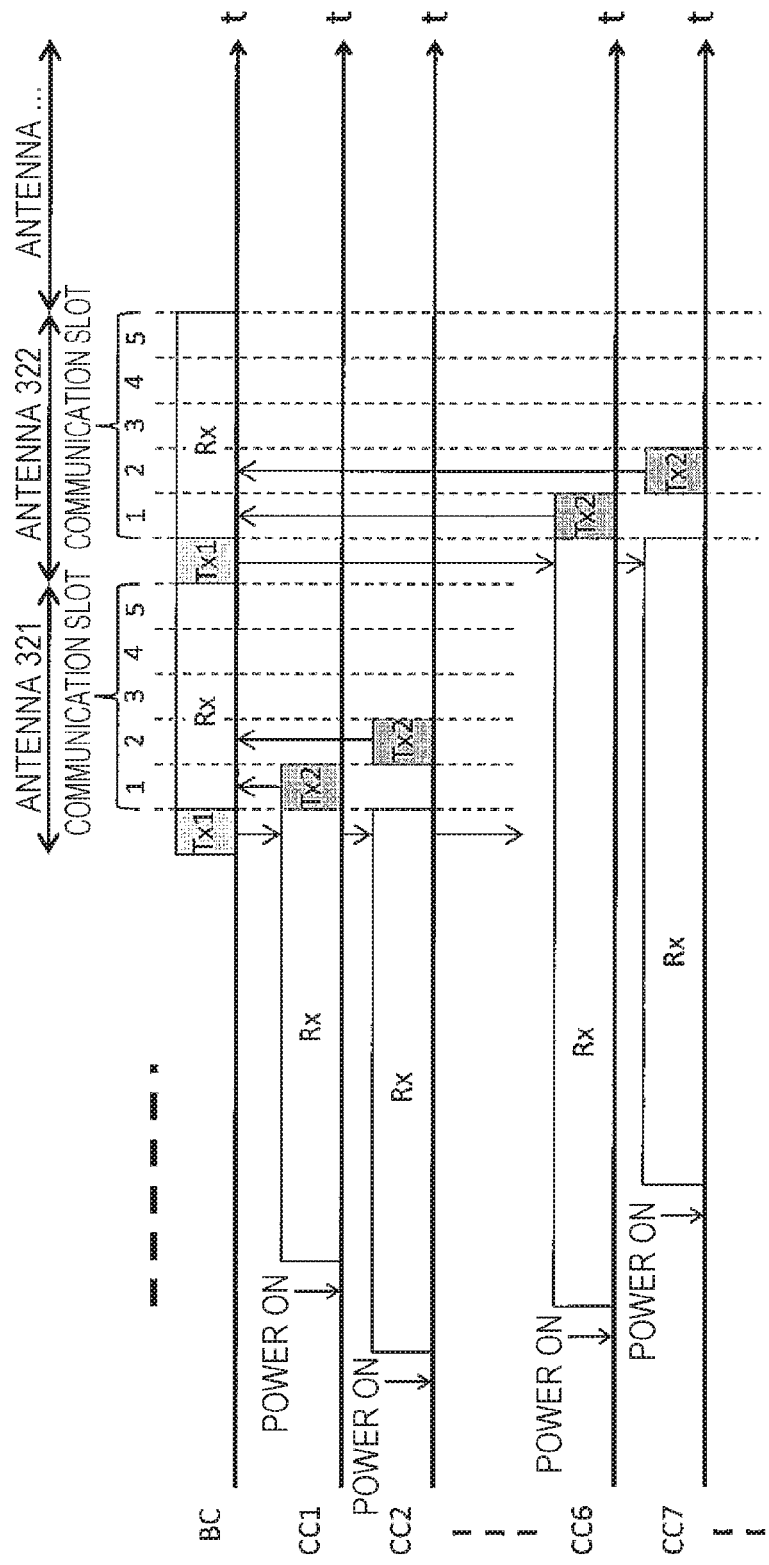
FIG. 6 is a time chart describing an intermittent operation of the cell controllers 100.

FIG. 6 is a time chart describing an intermittent operation of the cell controllers 100. Here, it is assumed that CCs 1 to 5 form a first cell controller group and CCs 6 to 10 form a second cell controller group, as illustrated in FIG. 2. Description of the intermittent operation of the cell controllers 100 is provided in the following, with reference to FIG. 6.

Each cell controller 100 enters a reception standby mode when turned on, and waits to receive a command requesting transmission of cell state from the battery controller 200. Upon receiving the command from the battery controller 200, the cell controller 100 determines a time slot for transmitting cell state and replies to the battery controller 200 by using the determined time slot. Further, the cell controller 100 sets the next timing for receiving a command requesting transmission of cell state from the battery controller 200 and transitions to a sleep mode (an operation mode in which power consumption is lower than that in the reception standby mode or the operation mode for transmitting cell state) until the timing arrives.

The next timing varies in accordance with the number of cell controllers 100 included in the battery control system 1. For example, a suitable value can be stored in advance in the memory 134 in accordance with the number of cell controllers 100, and the CPU 133 can set the value as the next timing.

The cell controller 100 transitions to the reception standby mode once again when the next timing having been set earlier arrives. The operations following this point are similar to those when the cell controller 100 is turned on.

First Embodiment: Summary

In the battery control system 1 pertaining to the first embodiment, one antenna is provided for each cell controller group, and the battery controller 200 switches between antennas by using the switch 310 and thereby selects a specific cell controller group as the communication opponent. Hence, even if the number of cell controllers 100 increases, communication between the battery controller 200 and each cell controller 100 can be ensured while suppressing the increase in the number of battery controllers 200.

Second Embodiment

In the first embodiment, description is provided that each cell controller 100 makes a transition to the sleep mode until the next reception timing as an operation procedure for suppressing the power consumption of the cell controller 100. In the second embodiment of the present invention, description is provided of another operation procedure for suppressing the power consumption of the cell controllers 100.

Figure 7:
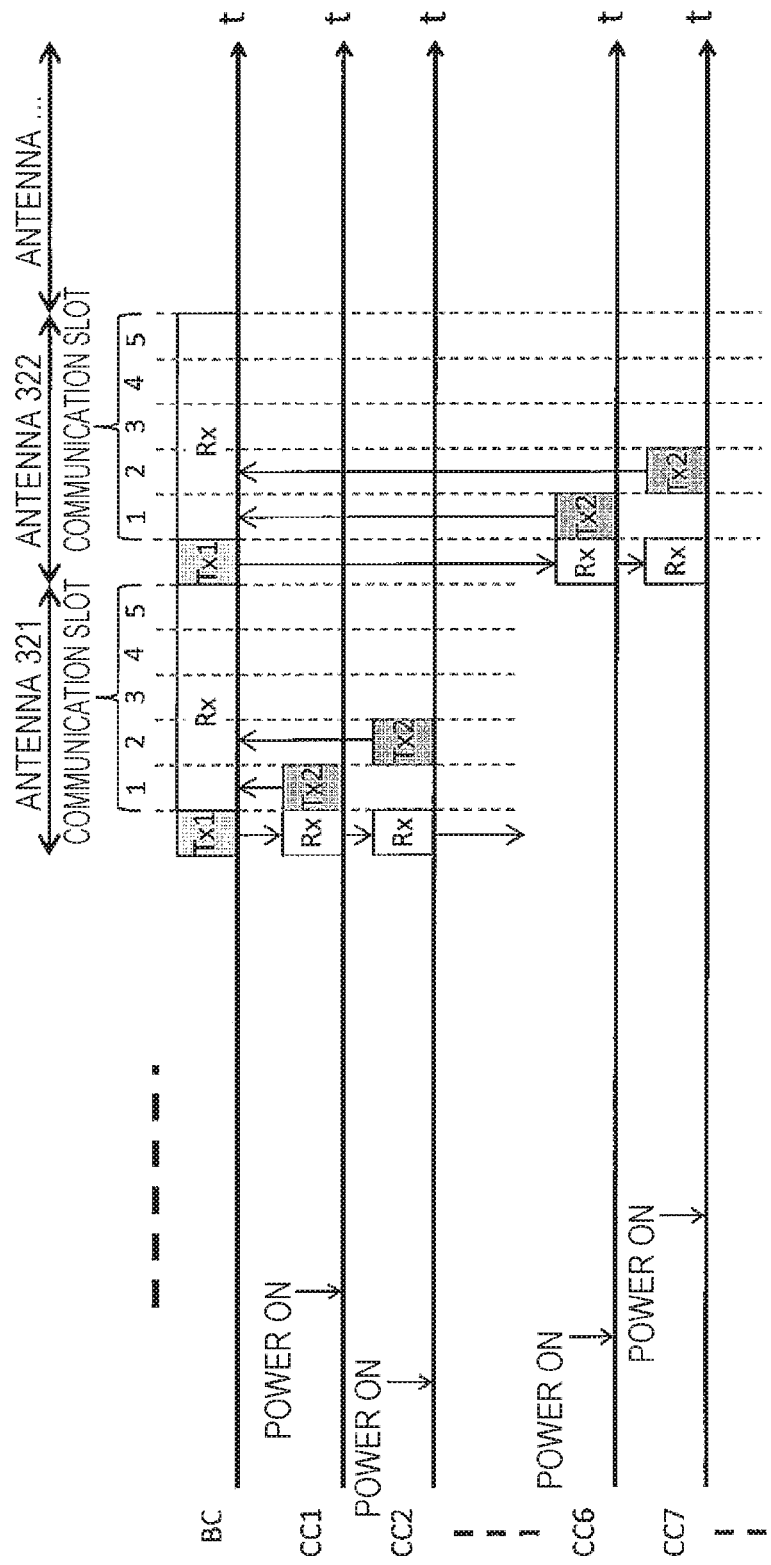
FIG. 7 is a time chart describing an intermittent operation of the cell controllers 100 in a second embodiment.

FIG. 7 is a time chart describing an intermittent operation of the cell controllers 100 in the second embodiment. Here, it is assumed that CCs 1 to 5 form a first cell controller group and CCs 6 to 10 form a second cell controller group, as illustrated in FIG. 2. Description of the intermittent operation of the cell controllers 100 is provided in the following, with reference to FIG. 7.

Each cell controller 100 transitions to an operation mode for measuring reception intensity (received signal strength Indication; RSSI) when turned on. When the battery controller 200 selects the antenna 321 and transmits a command requesting transmission of cell state, the reception intensity at CCs 1 to 5 becomes higher. Each cell controller 100 transitions to the reception standby mode when the reception intensity becomes equal to or higher than a predetermined threshold value. Here, CCs 1 to 5 accordingly transition to the reception standby mode. The operations following this point are similar to those in the first embodiment.

In order to cause the cell controllers 100 to transition to the reception standby mode, the battery controller 200 may for example transmit empty communication data for a predetermined initial period (for example, 1 ms) within the time slots for command transmission. It suffices to secure an amount of time sufficient for the cell controller 100 to transition from the reception intensity measurement mode to the reception standby mode as this predetermined period.

CCs 6 to 10 also transition to the operation mode for measuring reception intensity when turned on. However, while the battery controller 200 is selecting the antenna 321, the reception intensity does not reach the threshold value or higher and thus the CCs 6 to 10 do not transition to the reception standby mode. CCs 6 to 10 transition to the reception standby mode at the time point when the battery controller 200 selects the antenna 322 and transmits a command.

Figure 8:
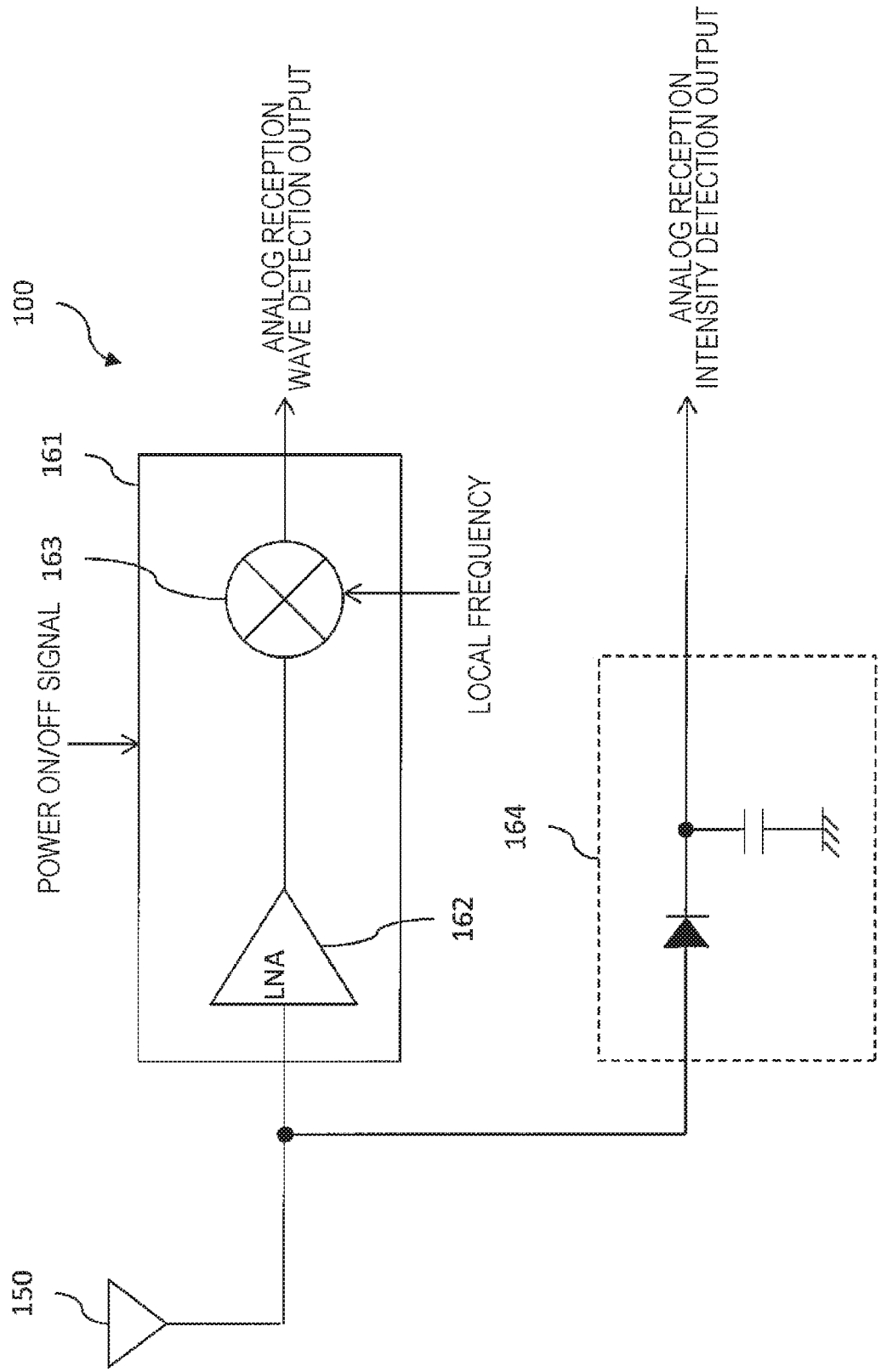
FIG. 8 is a diagram illustrating a configuration of the cell controller 100 in the second embodiment.

FIG. 8 is a diagram illustrating the structure of each cell controller 100 in the second embodiment. Description of structures already described in the first embodiment is omitted. A wave detection unit 161 amplifies the radio waves received by the antenna 150 by using a low-noise amplifier (LNA) 162 and performs wave detection by using a mixer 163. Meanwhile, a reception intensity detection unit 164 is capable of detecting reception intensity by using passive components such as a diode and a capacitor. Generally, these passive components have lower power consumption than the electronic components included in the wave detection unit 161. Accordingly, power consumption of the cell controller 100 in the reception intensity measurement mode can be made lower compared to that in the operation mode for performing wireless communication with the battery controller 200.

Third Embodiment

In the first and second embodiments, each cell controller 100, when responding to a command from the battery controller 200, may also transmit the response by using a reflection wave responsive to a non-modulated carrier wave transmitted by the battery controller 200. In the third embodiment of the present invention, description is provided of a configuration therefor.

Figure 9:
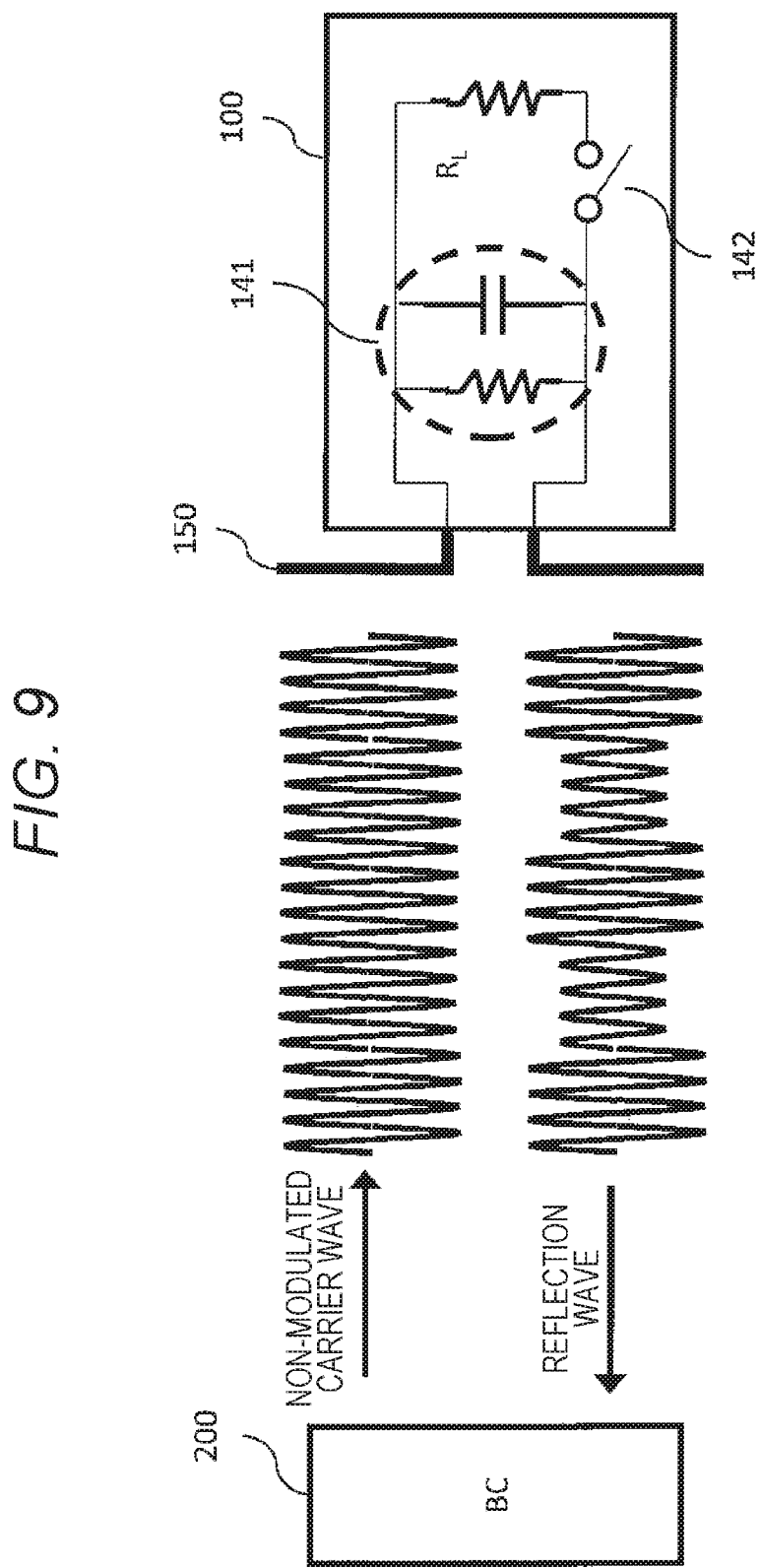
FIG. 9 is a diagram illustrating a configuration example in which the cell controller 100 responds by using a reflection wave.

FIG. 9 is a diagram illustrating a configuration example in which a cell controller 100 responds by using a reflection wave. In FIG. 9, it is supposed that the characteristics of the antenna 150 can be indicated by using an equivalent circuit 141. The antenna 150 is configured to transmit a reflection wave to the battery controller 200 when receiving a non-modulated carrier wave from the battery controller 200. The wireless circuit 140 includes a switch 142 and is capable of turning the switch 142 on and off and thereby applying amplitude modulation onto the non-modulated carrier wave. Through this amplitude modulation, response data responsive to the command received from the battery controller 200 can be expressed.

Figure 10:
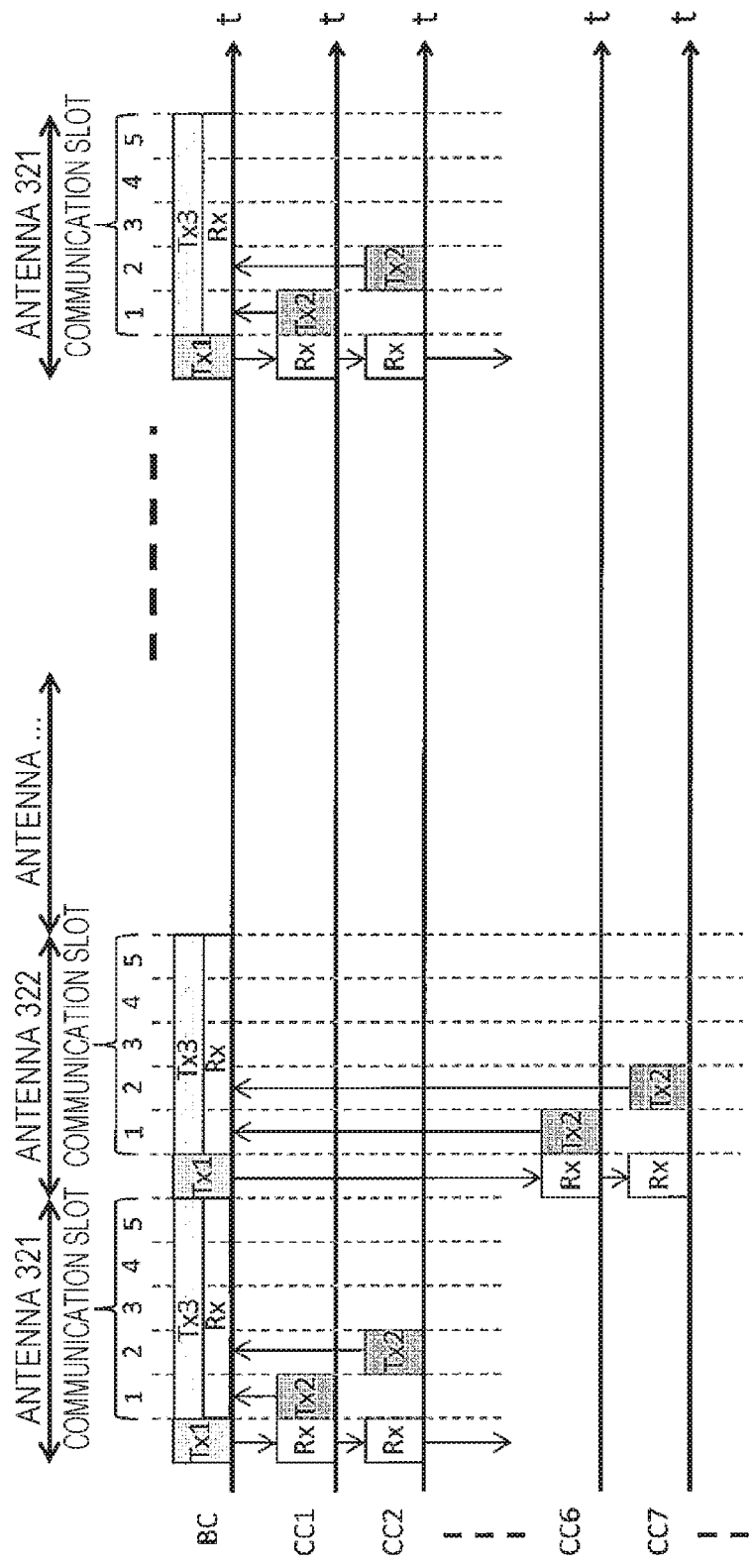
FIG. 10 is a time chart describing a procedure of communication between the battery controller 200 and the cell controllers 100 in a third embodiment.

FIG. 10 is a time chart describing the procedure of communication between the battery controller 200 and the cell controllers 100 in the third embodiment. Here, it is assumed that CCs 1 to 5 form a first cell controller group and CCs 6 to 10 form a second cell controller group, as illustrated in FIG. 2. Description of the communication procedure between controllers is provided in the following, with reference to FIG. 10.

To each cell controller 100, the battery controller 200 transmits a command requesting transmission of the states of the cells 10. After transmitting the command, the battery controller 200 continuously transmits a non-modulated carrier wave.

Upon receiving the command from the battery controller 200, each cell controller 100 waits until the time slot allocated thereto is reached. The cell controller 100 causes the switch 142 to operate and thereby performs the amplitude modulation when the time slot is reached. When the battery controller 200 is transmitting a non-modulated carrier wave at this point, transmission to the battery controller 200 as a reflection wave is performed after the amplitude modulation is applied onto the non-modulated carrier wave by the switch 142. Through this amplitude modulation, the cell controller 100 is capable of transmitting the data requested by the battery controller 200 (for example, data including description of the states of the cells 10) as a reply.

Third Embodiment: Summary

In the battery control system 1 pertaining to the third embodiment, each cell controller 100 responds to the battery controller 200 by using a reflection wave responsive to a non-modulated carrier wave and is thereby capable of suppressing power consumption during transmission.

Modifications of Present Invention

The present invention is not limited to the above-described embodiments, and various modifications are included therein. For example, the above-described embodiments have been described in detail in order to explain the present invention in an easily-understandable manner and are not necessarily limited to those including all the structures having been described. Further, some structures of a given embodiment can be replaced with structures from another embodiment, and further, structures from another embodiment can be added to the structures of a given embodiment. Further, with regard to some structures of each embodiment, deletion, replacement, and addition of other structures can be performed.

In the above embodiments, description is provided that when transmitting commands to the cell controllers 100, the battery controller 200 includes IDs of the antennas 321 and 322 in the transmission data. Since these IDs are provided for the cell controllers 100 to judge whether or not the commands are addressed to themselves when the cell controllers 100 receive the commands, and the IDs need not be the IDs of the antennas 321 and 322 as long as such a judgment can be made.

REFERENCE SIGNS LIST 1 battery control system
10 cell
100 cell controller
130 processor
140 wireless circuit
150 antenna
200 battery controller
210 wireless circuit
220 CPU
230 power supply circuit
240 memory
310 switch
321 to 322 antenna

The invention claimed is:

1. A battery control system, comprising:
a first cell controller and a second cell controller configured to acquire cell state;
a battery controller configured to control the first cell controller and the second cell controller;
a first antenna configured to perform wireless communication with the first cell controller;
a second antenna configured to perform wireless communication with the second cell controller; and
a switch configured to switch connection between the battery controller and the first antenna, and connection between the battery controller and the second antenna, wherein
when the battery controller communicates with the first cell controller, the battery controller is configured to connect the switch to the first antenna and thereby perform wireless communication with the first cell controller via the first antenna, and
when the battery controller communicates with the second cell controller, the battery controller is configured to connect the switch to the second antenna and thereby perform wireless communication with the second cell controller via the second antenna, wherein
the first antenna is configured to perform wireless communication with a first cell controller group having a plurality of cell controllers including the first cell controller, and
the second antenna is configured to perform wireless communication with a second cell controller group having a plurality of cell controllers including the second cell controller,
the first antenna being a single antenna configured to perform wireless communication with each of the cell controllers of the first plurality of cell controllers, and only with cell controllers of the first plurality of cell controllers, and
the second antenna being a single antenna, the second antenna different from the first antenna, configured to perform wireless communication with each of the cell controllers of the second plurality of cell controllers, and only with cell controllers of the second plurality of cell controllers.

2. The battery control system according to claim 1, wherein
the battery controller is configured to perform time-division switching between a state in which the switch is connected to the first antenna and a state in which the switch is connected to the second antenna and is thereby configured to perform time-division wireless communication with the first cell controller and the second cell controller.

3. The battery control system according to claim 1, wherein
when the battery controller performs wireless communication with the first cell controller, the battery controller is configured to transmit communication data including an identifier of the first antenna via the first antenna, and
when the battery controller performs wireless communication with the second cell controller, the battery controller is configured to transmit communication data including an identifier of the second antenna via the second antenna.

4. The battery control system according to claim 3, wherein
the first cell controller is configured to perform wireless communication with the battery controller only when the first cell controller receives, from the battery controller, wireless data including the identifier of the first antenna, and
the second cell controller is configured to perform wireless communication with the battery controller only when the second cell controller receives, from the battery controller, wireless data including the identifier of the second antenna.

5. The battery control system according to claim 1, wherein
the first cell controller and the second cell controller, when turned on, are configured to transition to a reception standby mode for waiting for wireless communication from the battery controller, and
the first cell controller and the second cell controller, after responding to the wireless communication received from the battery controller in the reception standby mode, are configured to remain, for a predetermined amount of time, in an operation mode in which power consumption is lower than power consumption in the reception standby mode and to transition to the reception standby mode once again after the predetermined amount of time elapses.

6. The battery control system according to claim 1, wherein
the first cell controller and the second cell controller, when turned on, are configured to transition to a reception intensity measurement mode for measuring reception intensity of radio waves that the battery controller transmits,
the first cell controller and the second cell controller are configured to transition to a reception standby mode for waiting for wireless communication from the battery controller when the reception intensity is equal to or higher than a predetermined threshold, and
the first cell controller and the second cell controller, after responding to the wireless communication received from the battery controller in the reception standby mode, are configured to return to the reception intensity measurement mode.

7. The battery control system according to claim 6, wherein
the first cell controller and the second cell controller are configured to operate, in the reception intensity measurement mode, by using an electronic component that consumes less power than an electronic component used in the reception standby mode.

8. The battery control system according to claim 1, wherein
the battery controller is configured to transmit a non-modulated carrier wave via the first antenna and the second antenna, and
the first cell controller and the second cell controller are configured to perform wireless communication with the battery controller by using a reflection wave responsive to the non-modulated carrier wave.

9. The battery control system according to claim 8, wherein
the first cell controller and the second cell controller are configured to apply amplitude modulation onto the non-modulated carrier wave by turning on/off a modulation switch,
the battery controller is configured to transmit the non-modulated carrier wave after transmitting a command requesting a response to the first cell controller and the second cell controller, and
the first cell controller and the second cell controller, once the command is received from the battery controller, are configured to start the amplitude modulation.

10. The battery control system according to claim 1, wherein
each of the cell controllers belonging to the first cell controller group is configured to perform wireless communication with the first antenna by using a time slot that is allocated in advance to the cell controller so as not to overlap with any other cell controller belonging to the first cell controller group, and
each of the cell controllers belonging to the second cell controller group is configured to perform wireless communication with the second antenna by using a time slot that is allocated in advance to the cell controller so as not to overlap with any other cell controller belonging to the second cell controller group.

11. The battery control system according to claim 9, wherein
the first cell controller and the second cell controller are configured to cause the amplitude modulation to be selectively applied onto the non-modulated carrier wave, and
the first cell controller and the second cell controller are configured to perform the amplitude modulation such that response data responsive to the command received from the battery controller is transmitted.

12. The battery control system according to claim 8, wherein
responsive to the non-modulated carrier wave, each of the first cell controller and the second cell controller is configured to use the reflection wave to suppress power consumption during transmission.

* * * * *